United States Patent
Rozenblit et al.

(10) Patent No.: US 6,950,636 B2
(45) Date of Patent: Sep. 27, 2005

(54) POWER AMPLIFIER CONTROL DRIVER HAVING OVER-CURRENT PROTECTION AND LINEAR CONTROL

(75) Inventors: Dmitriy Rozenblit, Irvine, CA (US); William J. Domino, Yorba Linda, CA (US); Morten Damgaard, Laguna Hills, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 423 days.

(21) Appl. No.: 10/313,611

(22) Filed: Dec. 6, 2002

(65) Prior Publication Data

US 2004/0198301 A1 Oct. 7, 2004

(51) Int. Cl.$^7$ .............................. H01Q 11/12; H04B 1/04
(52) U.S. Cl. ..................... 455/126; 455/127.2; 330/298
(58) Field of Search .......................... 455/126, 127.1, 455/127.2, 127.3, 115.1, 522; 330/278, 285, 291, 296, 297, 298; 375/297

(56) References Cited

U.S. PATENT DOCUMENTS

| | | | | |
|---|---|---|---|---|
| 3,662,290 A | * | 5/1972 | Elliott | 332/162 |
| 4,021,701 A | * | 5/1977 | Davies | 361/18 |
| 5,126,688 A | * | 6/1992 | Nakanishi et al. | 330/285 |
| 5,138,274 A | * | 8/1992 | Nakanishi et al. | 330/136 |
| 5,337,006 A | * | 8/1994 | Miyazaki | 330/130 |
| 5,589,796 A | * | 12/1996 | Alberth et al. | 330/133 |
| 5,606,285 A | * | 2/1997 | Wang et al. | 330/134 |
| 6,272,336 B1 | * | 8/2001 | Appel et al. | 455/423 |
| 6,466,772 B1 | | 10/2002 | Rozenblit et al. | 455/126 |
| 6,734,729 B1 | * | 5/2004 | Andrys et al. | 330/129 |

* cited by examiner

*Primary Examiner*—Nguyen T. Vo

(57) ABSTRACT

A linear power control loop for a power amplifier is disclosed. Embodiments of the invention linearly control the power amplifier output, prevent the power amplifier from failure induced by excessive supply current by reducing power amplifier bias current, and provide a mechanism to detect whether the power amplifier is operating in a saturation condition.

16 Claims, 6 Drawing Sheets

POWER AMPLIFIER CONTROL DRIVER HAVING OVER-CURRENT PROTECTION AND LINEAR CONTROL

BACKGROUND OF THE INVENTION

1. Field of the Invention

This invention relates generally to controlling the output power of a power amplifier. More particularly, the invention relates to a linear power control loop for controlling the output power of an amplifier contained in a portable communication handset. The invention also prevents an over-current condition and detects power amplifier saturation.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset, also referred to as a portable transceiver. The different modulation and transmission schemes each have advantages and disadvantages.

As these mobile communication systems have been developed and deployed, many different standards have evolved, to which these systems must conform. For example, in the United States, many portable communications systems comply with the IS-136 standard, which requires the use of a particular modulation scheme and access format. In the case of IS-136, the modulation scheme is narrow band offset $\pi/4$ differential quadrature phase shift keying ($\pi/4$-DQPSK), and the access format is TDMA.

In Europe, the global system for mobile communications (GSM) standard requires the use of the gaussian minimum shift keying (GMSK) modulation scheme in a narrow band TDMA access environment, which uses a constant envelope modulation methodology.

Furthermore, in a typical GSM mobile communication system using narrow band TDMA technology, a GMSK modulation scheme supplies a low noise phase modulated (PM) transmit signal to a non-linear power amplifier directly from an oscillator. In such an arrangement, a highly efficient, non-linear power amplifier can be used thus allowing efficient modulation of the phase-modulated signal and minimizing power consumption. Because the modulated signal is supplied directly from an oscillator, the need for filtering, either before or after the power amplifier, is minimized. Further, the output in a GSM transceiver is a constant envelope (i.e., a non time-varying amplitude) modulation signal.

Regardless of the type of modulation methodology employed, the output power supplied by the power amplifier must be controlled to provide the most efficient power level for the conditions under which the communication handset is operating. For example, in the GSM communication system, the power amplifier transmits in bursts and must be able to control the ramp-up of the transmit power as well as have a high degree of control over the output power level over a wide power range. This power control is typically performed using a feedback loop in which a portion of the signal output from the power amplifier is compared with a reference signal and the resulting error signal is fed back to the control input of the power amplifier.

In some other communication systems, the output power is controlled by a signal from the base station with which the portable transceiver is communicating. Typically, in such an arrangement, the base station simply sends a signal to the portable transceiver instructing the portable transceiver to increase or decrease power. In such systems, there is no specific power requirement, just the command to either increase or decrease power output.

Regardless of the type of power control employed, the output of the power amplifier is preferably controlled in precise steps. For communication handsets that use a bipolar transistor power amplifier, the output of the power amplifier is controlled by a control signal that is applied to the base terminal of the final stage (if multiple amplifier stages are employed) of the power amplifier. This is commonly referred to as the "base bias current."

As the conditions (e.g., temperature, battery voltage, antenna impedance, etc.) under which the communication handset operates vary, the power control loop acts to maintain the output power of the power amplifier constant by adjusting the base bias current. Increasing the base bias current generally causes the output of the power amplifier to increase.

While a conventional power control loop provides some control over the power output, some problems may arise. For example, if the base bias current increases past a certain level, the power amplifier is susceptible to failure. This can happen, for example, if the impedance of the antenna abruptly changes due to, for example, a change in the position of the portable transceiver relative to nearby reflective surfaces.

Another problem with a conventional power control loop is that the ratio of the base bias current to the output power characteristic is non-linear. At higher power levels, the level of the base bias control current must be disproportionately (i.e., non-linearly) raised to achieve a commensurate increase (in dB) in output power. This causes the "loop gain" of the power control loop to decrease at higher output power levels, which lengthens the response time of the power control loop. This manifests as an inability to quickly shut off the transmitter, which is a problem in systems such as GSM in which a burst transmission methodology demands fast power ramp-up and ramp-down times.

Linearizing the power control loop has been previously attempted by inserting a "shaper" stage into the power control loop. The shaper is a filter that is designed to exhibit a non-linear gain that has the inverse characteristic of the ratio of the base bias current to the output power. Unfortunately, it is difficult to obtain an exactly inverse characteristic, and the loop gain of the power control loop still decreases at higher output power, causing the response time of the power control loop to decrease.

Previous power control systems have protected the power amplifier by using various types of power amplifier saturation detection methodologies. Conventional saturation detectors sense the decrease in loop gain by observing a large error signal in the power control loop. Unfortunately, these systems require additional circuitry to reduce the base bias current when saturation is detected. For example, a logical "saturation detect" signal may be directed to a microprocessor or digital signal processor (DSP) in the communication handset. The microprocessor or DSP then directs the power control loop to reduce its target value until the saturation detect signal is cleared. A disadvantage of this type of system is that a single threshold is chosen to determine when the power amplifier has become, or is becoming, saturated. This is problematic because the power amplifier will not operate above this level, while the true saturation point of the power amplifier may be dependent on temperature and other variables that change over time.

Another conventional power control system measures only the base bias current. This protects the power amplifier from burning out, but measuring the base bias current provides only an indirect indication of the output power of the power amplifier.

Therefore it would be desirable to provide a power control loop for a power amplifier that exhibits linear response and that includes saturation detection and over-current protection.

SUMMARY

Embodiments of the invention include a linear power control loop for a power amplifier. Embodiments of the invention linearly control the power amplifier output, prevent the power amplifier from failure induced by excessive supply current by reducing power amplifier bias current, and provide a mechanism to detect whether the power amplifier is operating in a saturation condition. In one embodiment, the invention is a linear power control loop for a power amplifier, comprising a detector for providing a direct current (DC) baseband signal representing an output of a power amplifier, a comparator for comparing the DC baseband signal to a reference signal and generating an error signal, a filter, and a power amplifier control current driver for linearly controlling the output of the power amplifier.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the linear power control loop having overcurrent protection and saturation detection (referred to below as the "linear power control loop") can be implemented in any system that uses a bipolar power amplifier having bias current control.

The linear power control loop can be implemented in software, hardware, or a combination of software and hardware. In a preferred embodiment, the linear power control loop may be implemented in hardware. The hardware of the invention can be implemented using specialized hardware elements and logic. If portions are implemented in software, the software portion can be stored in a memory and be executed by a suitable instruction execution system (microprocessor). The hardware implementation of the linear power control loop can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The software of the linear power control loop comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
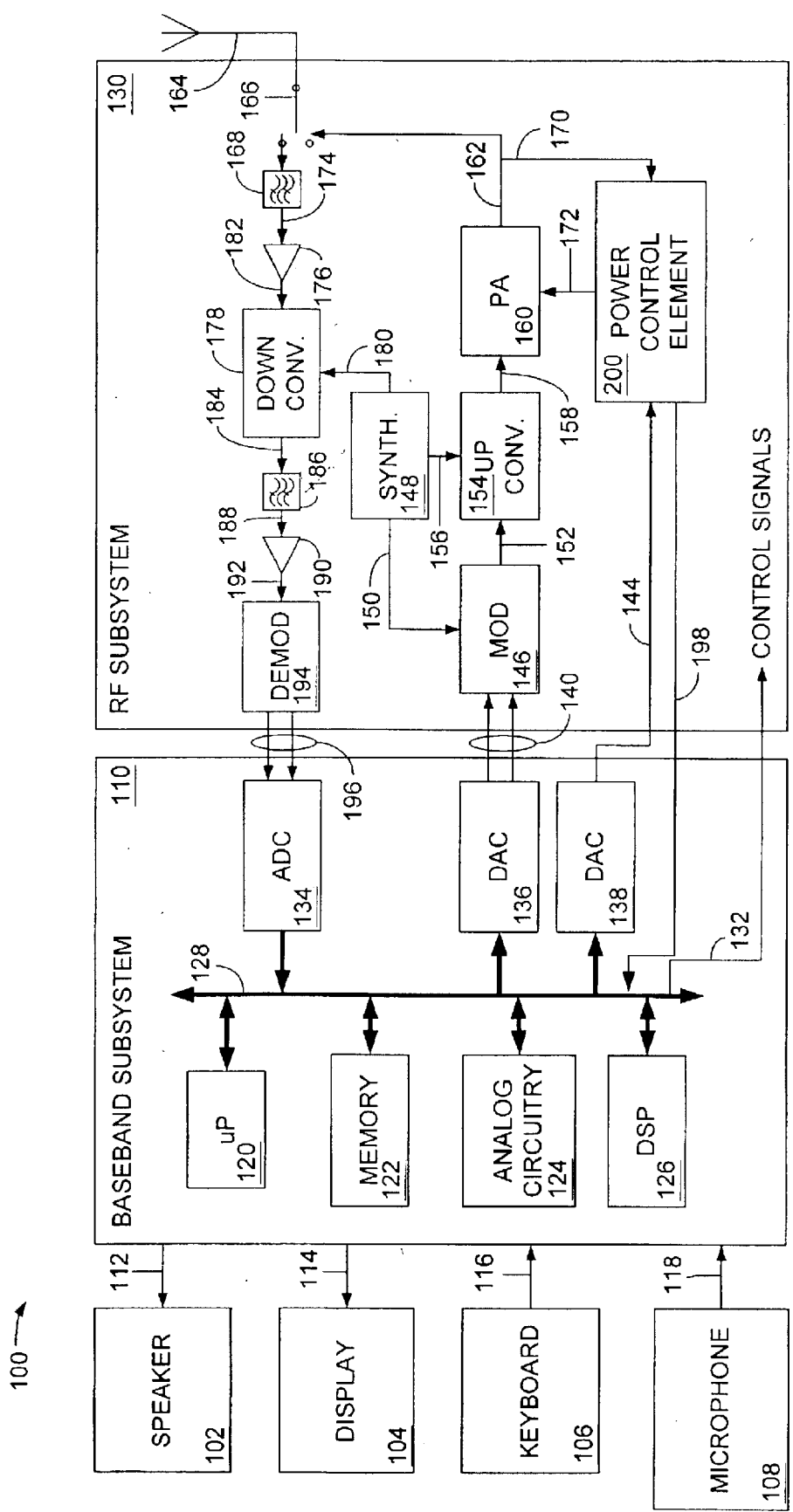
FIG. 1 is a block diagram illustrating a simplified portable transceiver.

FIG. 1 is a block diagram illustrating a simplified portable transceiver 100. Portable transceiver 100 includes speaker 102, display 104, keyboard 106, and microphone 108, all connected to baseband subsystem 110. In a particular embodiment, portable transceiver 100 can be, for example but not limited to, a portable telecommunication handset such as a mobile/cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated herein.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. DAC 138 provides a reference voltage power level signal to power control element 200 via connection 144. Connection 140, while shown as two directed arrows, includes the information that is to be transmitted by RF subsystem 130 after conversion from the digital domain to the analog domain. As will be described in detail below, in one embodiment of the invention, the power control element 200 provides a saturation detection signal (e.g., sat_detect) via connection 198 to the baseband subsystem 110.

RF subsystem 130 includes modulator 146, which, after receiving a frequency reference signal, also called a "local oscillator" signal, or "LO," from synthesizer 148 via connection 150, modulates the received analog information and provides a modulated signal via connection 152 to upconverter 154. In a constant envelope modulation methodology, the modulated transmit signal generally includes only phase information. Upconverter 154 also receives a frequency reference signal from synthesizer 148 via connection 156. Synthesizer 148 determines the appropriate frequency to which the upconverter 154 upconverts the modulated signal on connection 152.

Upconverter 154 supplies the modulated signal via connection 158 to power amplifier 160. Power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132. Alternatively, the switch 166 may be replaced by a filter pair (e.g., a duplexer) that allows simultaneous passage of both transmit signals and receive signals, as known in the art.

A portion of the amplified transmit signal energy on connection 162 is supplied via connection 170 to power control element 200. The power control element 200 generally forms a closed power control feedback loop to control the output power of power amplifier 160 and may also supply a power control feedback signal via connection 172. In accordance with an aspect of the invention, the power control element is linear in that it supplies a power amplifier control signal via connection 172 that is linearly proportional to the power output (measured in dBm) of the power amplifier 160. Generally, the power amplifier 160 has a control characteristic that is substantially linear with respect to the input control current ($I_{CTRL}$ IN)/power output (dBm OUT) until the power amplifier enters saturation. The power control element 200 is generally linear with respect to power input (dBm IN)/output control current ($I_{CTRL}$ OUT). Therefore, negating power in dBm, the power control element 200 has a logarithmic characteristic, while the power amplifier 160 has an anti-logarithmic characteristic. When taken together, the characteristics of the power amplifier 160 and the power control element 200 result in a linear power control loop. In accordance with alternative embodiments of the invention, the power control element 200 also provides protection against the power amplifier entering an overcurrent state, which could cause the power amplifier 160 to fail. The power control element 200 also provides a saturation detection function that can determine whether the power amplifier 160 is operating in a saturated mode, and if so detected, inform the baseband subsystem 110, via connection 198, which in turn may reduce the output of the power amplifier via the power amplifier control signal on connection 172 by a signal sent over connection 144 to the power control element 200.

A signal received by antenna 164 will be directed to receive filter 168. Receive filter 168 will filter the received signal and supply the filtered signal on connection 174 to low noise amplifier (LNA) 176. Receive filter 168 is a band pass filter, which passes all channels of the particular cellular system in which the portable transceiver 100 is operating. As an example, for a 900 MHz GSM system, receive filter 168 would pass all frequencies from 935.2 MHz to 959.8 MHz, covering all 124 contiguous channels of 200 kHz each. The purpose of this filter is to reject all frequencies outside the desired region. LNA 176 amplifies the very weak signal on connection 174 to a level at which downconverter 178 can translate the signal from the transmitted frequency to an IF frequency. Alternatively, the functionality of LNA 176 and downconverter 178 can be accomplished using other elements, such as, for example but not limited to, a low noise block downconverter (LNB).

Downconverter 178 receives a frequency reference signal, also called a "local oscillator" signal, or "LO", from synthesizer 148, via connection 180, which signal instructs the downconverter 178 as to the proper frequency to which to downconvert the signal received from LNA 176 via connection 182. The downconverted frequency is called the intermediate frequency or IF. Downconverter 178 sends the downconverted signal via connection 184 to channel filter 186, also called the "IF filter." Channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, determines the selected channel. Amplifier 190 amplifies the received signal and supplies the amplified signal via connection 192 to demodulator 194. Demodulator 194 recovers the transmitted analog information and supplies a signal representing this information via connection 196 to ADC 134. ADC 134 converts these analog signals to a digital signal at baseband frequency and transfers the signal via bus 128 to DSP 126 for further processing. As an alternative, the downconverted carrier frequency (IF frequency) at connection 184 may be 0 Hz, in which case the receiver is referred to as a "direct conversion receiver." In such a case, the channel filter 186 is implemented as a low pass filter, and the demodulator 194 may be omitted.

Figure 2:
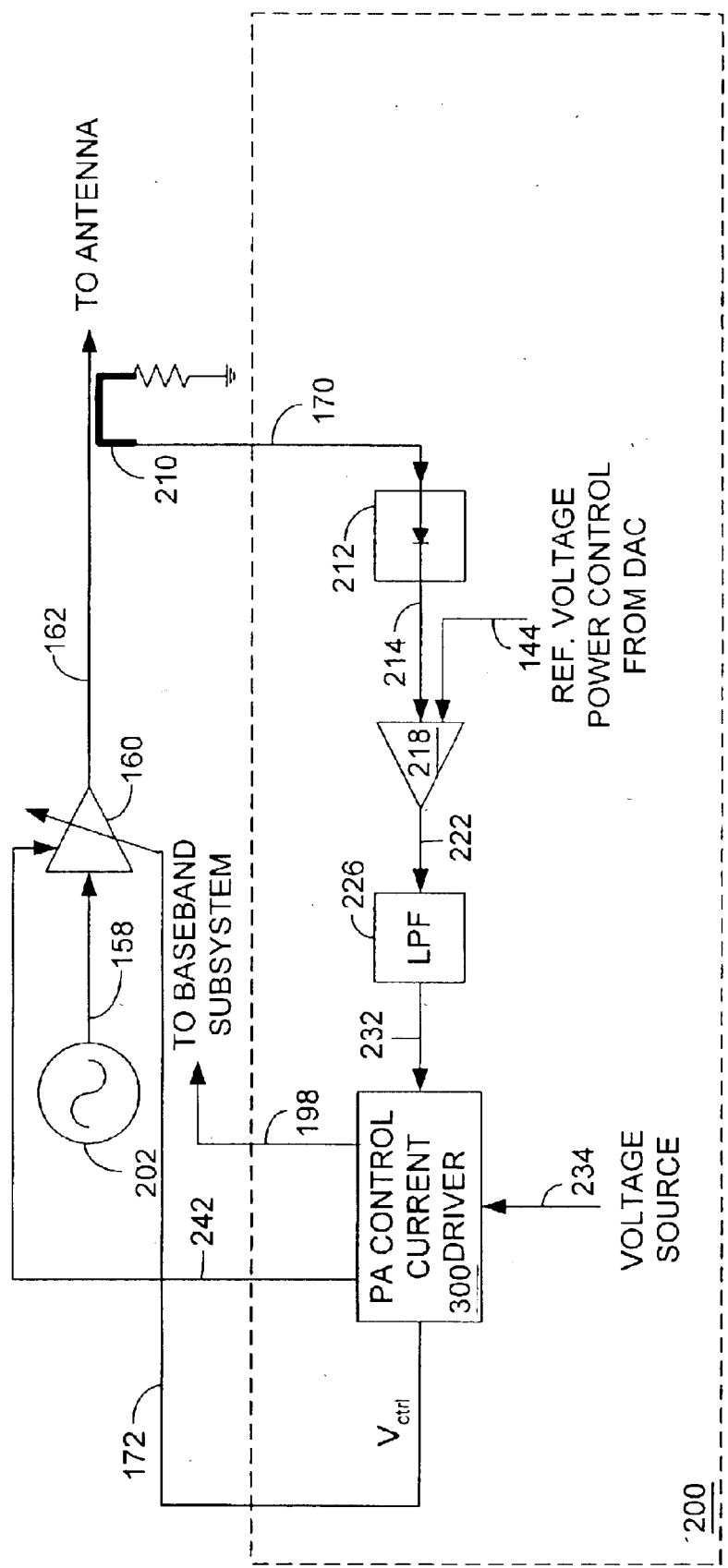
FIG. 2 is a block diagram illustrating the power control element of FIG. 1.

FIG. 2 is a block diagram illustrating the power control element 200 of FIG. 1. For simplicity, the function of the modulator 146 and the upconverter 154 of FIG. 1 are illustrated in FIG. 2 using oscillator 202. Oscillator 202, which may be a voltage controlled oscillator (VCO), supplies a low-noise modulated signal (i.e, a signal with very low out-of-band noise) via connection 158 to the power amplifier 160. By using an oscillator 202 to supply a low-noise modulated signal to power amplifier 160, the need for filtering before and after the power amp 160 may be reduced or eliminated.

A portion of the output power present on connection 162 is diverted by coupler 210 via connection 170 to a logarithmic (log) detector 212. The log detector 212 receives the RF signal on connection 170 and provides, on connection 214, a direct current (DC) baseband signal representing the level of the RF power signal present on connection 170. The output of the log detector 212 is supplied on connection 214 to a comparator 218. A reference voltage power control signal from the DAC 138 of FIG. 1 is supplied via connection 144 to the comparator 218. The comparator 218 compares the signal level on connection 214 with the signal level on connection 144 and provides an error signal representing the difference on connection 222.

The error signal on connection 222 is supplied to a low pass filter (LPF) 226. The LPF 226 acts as an integrator, integrating the error signal on connection 222 to provide a control voltage signal on connection 232. The control voltage signal on connection 232 represents the difference between the output power measured from the power amplifier 160 and the desired output level supplied on connection 144, integrated over time such that the result is essentially proportional to the desired power output of the power amplifier in dBm.

The control voltage signal on connection 232 is supplied to the power amplifier (PA) control current driver 300. The power amplifier control current driver 300, as will be described in detail below, provides a linear control signal via connection 172 to the control input of the power amplifier 160. The power amplifier control current driver 300 receives the control voltage signal on connection 232 and supplies a control current signal on connection 172. The power amplifier control current driver also receives a battery voltage (V+) on connection 234 and provides a power amplifier supply voltage to the power amplifier 160 via connection 242.

Figure 3:
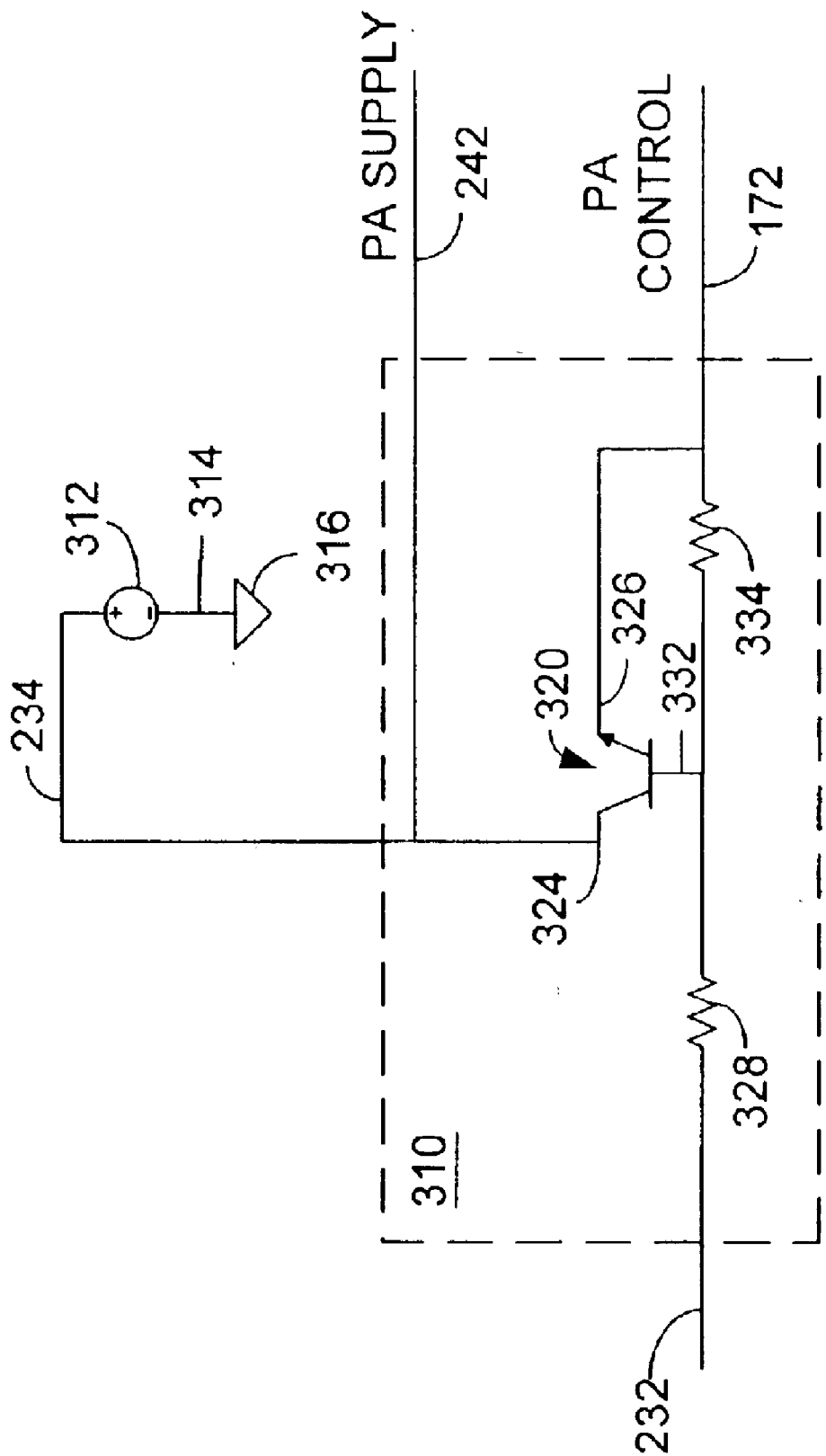
FIG. 3 is a schematic diagram illustrating a first embodiment of the PA control current driver of FIG. 2.

FIG. 3 is a schematic diagram illustrating a first embodiment 310 of the power amplifier control current driver 300 of FIG. 2. The power amplifier control current driver 310 is supplied by a voltage source 312 having one terminal coupled to ground 316 via connection 314. The voltage source 312 can be, for example, a battery located in a communication handset that supplies a DC voltage of approximately 3.8 volts (V). Alternatively, the voltage source can be other devices, such as, for example, a fuel cell.

The voltage source 312 is coupled to the power amplifier control current driver 310 via connection 234. The voltage level on connection 234 can be referred to as the "battery voltage." In this embodiment, the power amplifier control current driver 310 includes a transistor 320. The transistor 320 includes a collector terminal 324, a base terminal 332, and an emitter terminal 326. The transistor can be referred to as a power control transistor. Preferably, the transistor 320 is a bipolar junction transistor (BJT), but a field effect transistor (FET) could also be suitable. The battery voltage on connection 234 is coupled to the collector terminal 324 of the transistor 320. The operation power supplied to the power amplifier 160 (FIG. 2) may come from the same voltage source 312, via connection 242, or it may come from another source.

The connection 232 is the output of the low pass filter 226 (FIG. 2) and is coupled to a resistor 328. The resistor 328 is also coupled to the base terminal 332 of the transistor 320. Another resistor 334 is coupled to the base terminal 332 of transistor 320. The resistor 328 preferably has a value of 50 Ω and the resistor 334 preferably has a value of 100 Ω. The emitter terminal 326 of the transistor 320 is also coupled to one terminal of the resistor 334. This node forms the output 172 of the power control element 200 (FIG. 2). A power amplifier control current signal is supplied over connection 172 to the power amplifier 160. In a heterojunction bipolar transistor (HBT) power amplifier, the power amplifier control current signal is supplied to the base terminal (not shown, but coupled to connection 172) of the power amplifier 160 (FIG. 2).

In accordance with an aspect of the invention, the power amplifier control current signal provided on connection 172 increases proportionally and substantially linearly with the RF power output of the power amplifier 160 (FIG. 2). The power amplifier control current signal on connection 172 directly affects the power gain and power output of the power amplifier 160. However, for increasing levels of output power, a disproportionately large increase in the voltage on the control input (connection 172) of the power amplifier 160 is needed to achieve the desired current output from the power amplifier 160. This is illustrated below in the graph 600 shown in FIG. 6, where the voltage on the control input 172 of the power amplifier 160 is referred to as "Vctrl" and the RF output power of the power amplifier 160 is referred to as "Pout" (dBm) and is plotted against Vctrl. The graph 600 includes a trace 610, which includes a linear region 615 and a saturated region 620.

Figure 6:
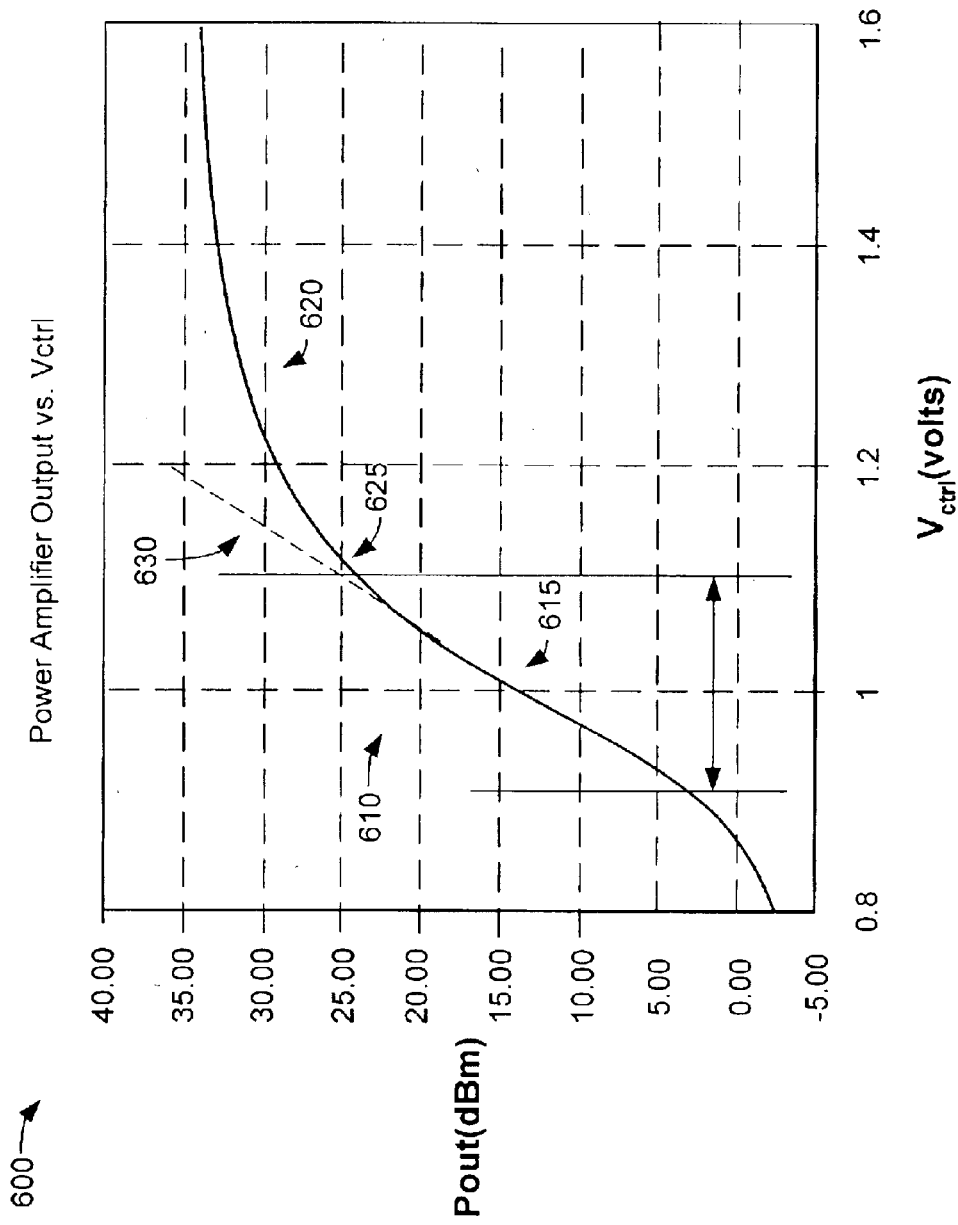
FIG. 6 is a graphical illustration showing the relationship between the power output (Pout) of the power amplifier in dBM, and the control voltage, Vctrl, on connection 172 of FIG. 2.

As shown in FIG. 6, for an exemplary bipolar transistor, for voltage levels above approximately 1.1V, the output of the power amplifier 160 increases disproportionately in response to the voltage Vctrl, eventually driving the power amplifier into saturation. The line 630 represents an ideal linear relationship between power output and control voltage. Without the power amplifier control current driver 300, the control voltage, Vctrl, would have to be supplied by connection 232 (FIG. 2). Since the control voltage signal on connection 232 is the integrated error signal of the control loop, it is desired that the RF power output of power amplifier 160 be proportionally and linearly related to this voltage. Therefore, the function of the power amplifier control current driver 300 is to drive additional current, as needed, to effectively linearize the relationship between the RF power output of the power amplifier 160 and the control voltage signal on connection 232.

For example, as the power amplifier 160 demands more current from the supply via connection 242 (in order to provide more output power), the current input on connection 232 (i.e., due to the control voltage signal provided by the low pass filter 226 of FIG. 2), continues to increase. As the voltage (and current) on connection 232 continues to increase, the current through resistors 328 and 334 increases and therefore, the voltage across resistor 334 increases. The voltage across resistor 334 is the base-to-emitter voltage ($V_{BE}$) of transistor 320. As $V_{BE}$ of transistor 320 increases, the transistor 320 gradually turns on and supplies an increasing amount of current from its collector terminal 326. This current from transistor 320 constitutes a supplemental current, which is added to the power amplifier control current signal on connection 172 (FIG. 3). The increased current on connection 172 causes the power amplifier 160 (FIG. 2) to consume more power from the voltage source 312 via connection 242 and therefore the RF power gain of the power amplifier 160 will increase. Because the transistor 320 adds the supplemental current from the emitter terminal 326 to the power amplifier control current signal via connection 172, it makes the RF power output of the power amplifier 160 substantially proportional and linear to the voltage on connection 232.

The transistor 320 begins to turn on at a predetermined level, which is determined by the value of the resistor 334. Assuming that no supplemental current is added by the transistor 320, there will be some current flowing through resistor 334 that, when driven into the power amplifier control input on connection 172, corresponds to a voltage at the power amplifier control input 172. The transistor 320 should begin to turn on when the current through the resistor 334 causes the voltage across the resistor 334 to reach approximately 0.7V. When the transistor 320 turns on its current increases as the input voltage (and current) on connection 232 increases. Therefore, as the power amplifier 160 demands more supply current, the power amplifier gets the current via connection 242 while the input voltage on connection 232 need not increase disproportionately with respect to the desired RF output power of the power amplifier 160. Rather, the level of the control voltage signal on connection 232 need only increase approximately linearly with respect to the output of the power amplifier 160 (FIG. 2).

Figure 4:
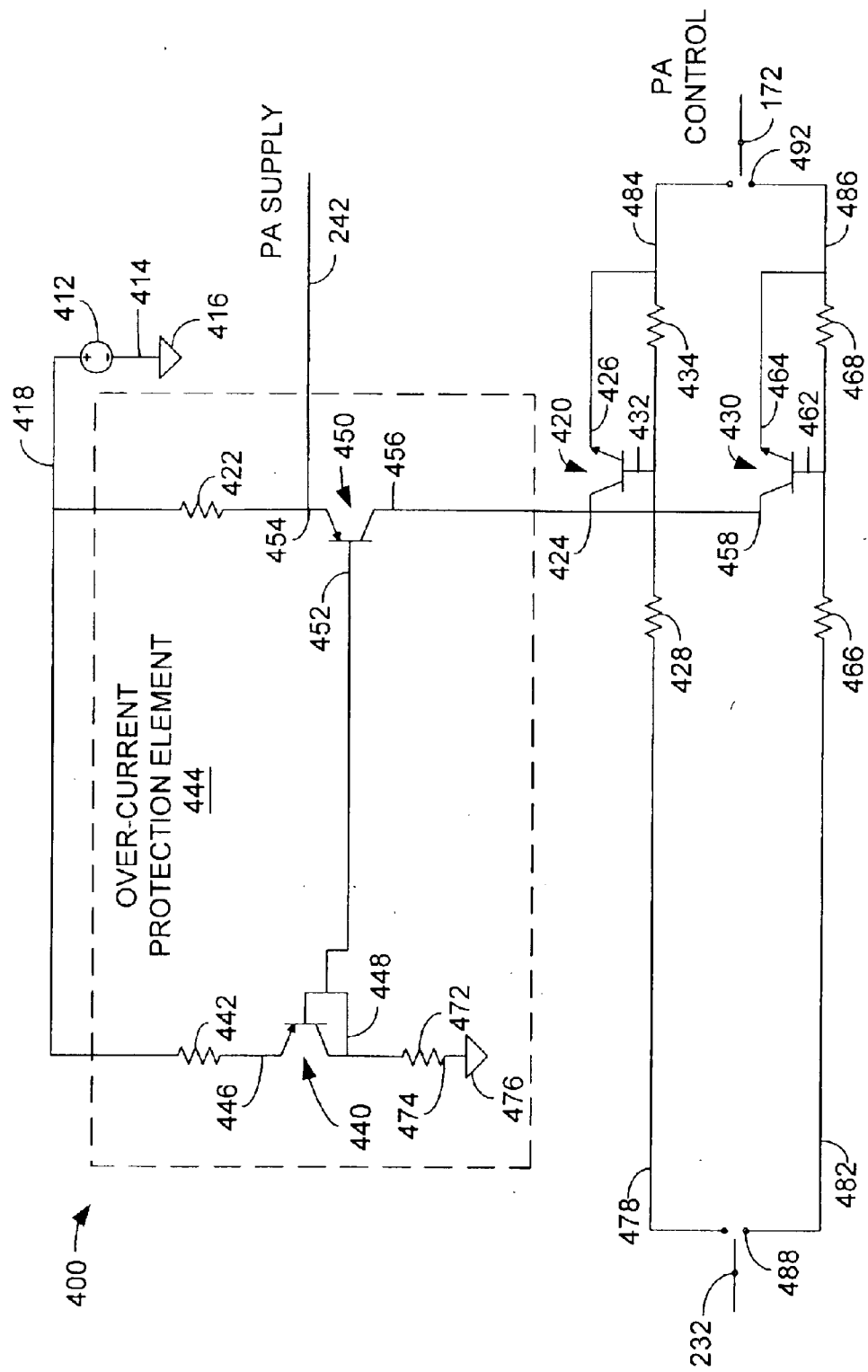
FIG. 4 is a schematic diagram illustrating a first alternative embodiment of the PA control current driver of FIG. 2.

FIG. 4 is a schematic diagram illustrating a first alternative embodiment 400 of the PA control current driver 300 of FIG. 2. FIG. 4 contains many elements that are similar in function to those described above in FIG. 3. The elements in FIG. 4 that are similar to the elements in FIG. 3 are similarly labeled. For example, the transistor 320 of FIG. 3 is labeled transistor 420 in FIG. 4. The transistor 420 in FIG. 4 performs the same function as the transistor 320 in FIG. 3. Accordingly, the components in FIG. 4 that were previously described in FIG. 3 will not again be described in detail.

In FIG. 4, an additional transistor 430, resistor 466 and resistor 486, all coupled in parallel with the transistor 320, resistor 428 and resistor 434 is illustrated. The transistor 430 and related circuitry can be used in an implementation in which the portable communication device, in which the PA control current driver is located, is capable of transmitting multiple communication methodologies. For example, the input on connection 232 can be directed by switch 488 onto connection 478 for a first modulation type while the input on connection 232 may be directed by switch 488 onto connection 482 if modulation of a different type is possible using the portable communication handset in which the power amplifier control current driver is located. Similarly, the switch 492 directs the output of either the transistor 420 or the transistor 430 onto connection 172. The switches 488 and 492 can be controlled by, for example, a control signal from the baseband subsystem 110 via connection 132 (FIG. 1).

In response to the power amplifier 160 (FIG. 2) demanding increased current so that it can provide higher output power, the current at the collector terminal 424 of transistor 420 will continue to increase in response to the power demand from the power amplifier 160. Unfortunately, the current at the collector terminal 424 of transistor 420 will continue to increase until the power amplifier 160 consequently draws too much current from its supply, and fails catastrophically. This is a condition is sometimes referred to as "burn-out."

In the embodiment illustrated in FIG. 4, the power amplifier control current driver 400 includes an over-current protection element 444. The over-current protection element 444 comprises a transistor 440 configured as a diode, and a transistor 450. The transistor 440 includes an emitter terminal 446, which is coupled to battery voltage on connection 418 via resistor 442. Preferably, the resistor 442 has a value of approximately 50 Ω. The collector terminal and the base terminal of the transistor 440 are shorted via connection 448, thus forming a diode.

The shorted collector and base terminal of transistor 440 provides a constant base bias voltage to the base terminal 452 of transistor 450. The transistor 450 includes an emitter terminal 454 coupled to battery voltage on connection 418 through the resistor 422 and a collector terminal 456 coupled to the collector terminal 424 of the transistor 420. As the current on the collector terminal 424 of transistor 420 continues to rise, it causes the current drawn from the power amplifier 160 (FIG. 2) via connection 242 to eventually reach a predetermined level at which the transistor 450 begins to shut off. In this manner, the power amplifier is prevented from failing due to an over-current condition.

To determine the predetermined level at which the transistor 450 begins to shut off, a maximum power amplifier supply current is determined. The maximum power amplifier supply current is chosen to prevent the power amplifier 160 from burning out. This current causes a certain voltage drop across the resistor 422. The value of the resistor 442 is then chosen to have the same voltage drop, but with a significantly lower current. For example, if the value of the resistor 422 is 50 mΩ and if the value of the resistor 442 is 50 Ω, the current consumed by resistor 442 to obtain the desired bias current is 1/1000 of the maximum power amplifier supply current.

For example, the voltage at the base terminal 452 of the transistor 450 is at a fixed level. Accordingly, when the current drawn from the power amplifier 160 (FIG. 2) via connection 242 reaches a predetermined level, the voltage drop across the emitter terminal 454 and the base terminal 452 of the transistor 450 causes the transistor 450 to begin turning off. The transistor 450 is biased using the transistor 440 configured as a diode to maintain a constant voltage on the base terminal 452 of transistor 450. The emitter terminal 454 is supplied from the voltage source 412 via connection 418 through the resistor 422, through which also passes the power amplifier supply current via connection 242. The value of the resistor 422 is preferably 50 mΩ. Thus, the transistor 450 compares the voltage drop across the 50 mΩ resistor 422 to a reference voltage on connection 452 and begins to turn off when the current drawn via connection 242 causes a sufficient voltage increase across the 50 mΩ resistor 422.

As the transistor 450 begins to turn off, the transistor 420 (or the transistor 430 if used) can no longer supply as much supplemental control current to connection 172. Therefore, the power amplifier control signal on connection 172 is reduced, thereby preventing the power amplifier 160 (FIG. 2) from entering an over-current condition and possibly failing.

Figure 5:
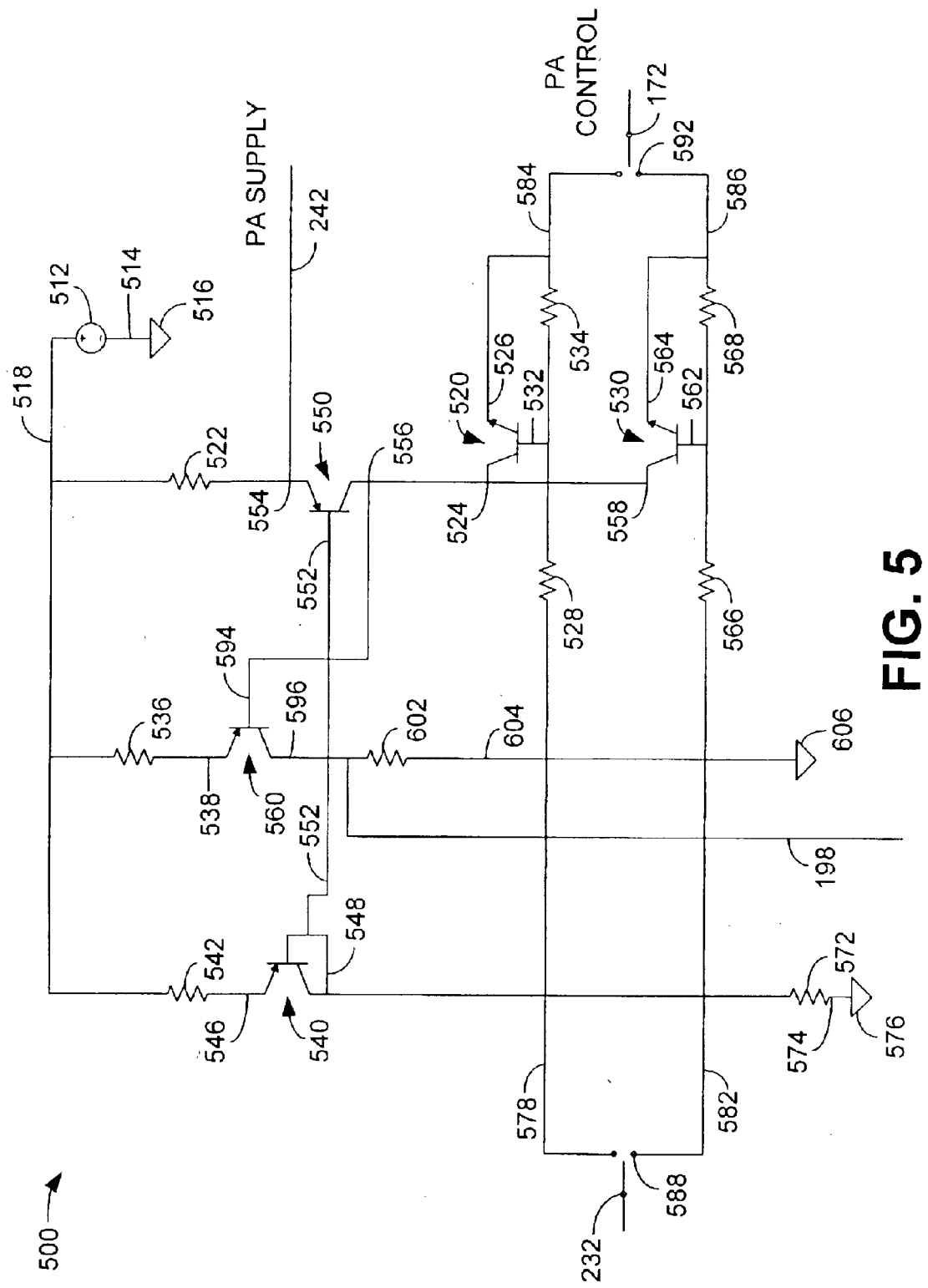
FIG. 5 is a schematic diagram illustrating a second alternative embodiment of the PA control current driver of FIG. 2.

FIG. 5 is a schematic diagram illustrating a second alternative embodiment 500 of the PA control current driver 300 of FIG. 2. The elements in FIG. 5 that have been previously discussed are numbered similarly to those in FIGS. 3 and 4 and will not again be described in detail. FIG. 5 includes a saturation detection transistor 560 having an emitter terminal 538 coupled to battery voltage on connection 518 via resistor 536. Preferably, the value of the resistor 536 is 100 Ω. The collector terminal 596 of the transistor 560 is coupled through a resistor 602 to ground 606 via connection 604. Preferably, the value of the resistor 602 is 1 KΩ. The base terminal 594 of the transistor 560 is coupled to the collector terminal 556 of the transistor 550.

During normal operation of the power amplifier 160 (i.e., when the power amplifier 160 is not in danger of an over-current condition), the transistor 550 is on, and the voltage present at the collector terminal 556 of transistor 550 is at a level that is slightly below (approximately 100 millivolts (mV)) the level of the supply voltage of the voltage source 512 on connection 518. Therefore, the voltage drop from the base 594 to the emitter 538 of the transistor 560 is small, causing transistor 560 to be shut off. Accordingly, the voltage at the collector terminal 596 of the transistor 560 is close to zero, as this point is pulled down through the resistor 602.

When the PA supply current on connection 242 increases until it reaches a pre-defined over-current condition, the over-current protection is provided by the transistor 550 being turned off (as described in FIG. 4), and the voltage on the base terminal 594 of the transistor 560 will decrease until the transistor 560 will turn on, thereby causing the voltage across the resistor 602 to be pulled up to the voltage of the voltage source 512 through the resistor 536. The resistor 602 is coupled to the connection 198. When the transistor 560 turns on, the voltage level on the connection 198 goes up to essentially the same voltage as the battery voltage. This can be used as a saturation detection (sat_detect) signal and is supplied to the baseband subsystem 110 of FIG. 1 via connection 198. In this manner, the baseband subsystem 110 can act to reduce the current supplied to the power amplifier 160 (FIG. 2) by requesting a lower power level via the control signal on connection 144 (FIG. 1).

The saturation detection transistor 560 operates as described because the collector terminal 556 of the transistor 550 provides a convenient signal for the detection of the power amplifier 160 (FIG. 2) reaching its maximum operating point. As the power amplifier 160 reaches its maximum operating point, the voltage at the collector terminal 556 of the transistor 550 begins to drop. The transistor 560 is connected such that it is off when the power amplifier 160 is providing low power and turns on when the power amplifier 160 reaches maximum power, or any other desired threshold as determined by the value of the resistor 536. Therefore, when the power amplifier 160 reaches maximum power, the sat_detect signal is generated by the transistor 560 and supplied to the baseband subsystem 110 (FIG. 1).

FIG. 6 is a graphical illustration 600 showing the relationship between the power output (Pout) of the power amplifier 160 in dBm and the control voltage, Vctrl, on connection 172 (FIG. 2). The power output of the power amplifier is represented on the vertical axis and the control voltage ($V_{ctrl}$) on connection 172 is represented on the horizontal axis. As shown, the power output of the power amplifier 160 remains substantially linear for control voltages between approximately 0.9V through 1.1V.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A linear power control loop for a power amplifier, comprising:
   a detector for providing a direct current (DC) baseband signal representing an output of a power amplifier;
   a comparator for comparing the DC baseband signal to a reference signal and generating an error signal;
   a filter; and
   a power amplifier control current driver for linearly controlling the output of the power amplifier comprising:
   a power control transistor responsive to the error signal and configured to add a supplemental current to the error signal, wherein the output of the power amplifier remains proportional to the error signal; and
   an over-current protection circuit coupled to the power control transistor comprising a protection transistor responsive to a power amplifier supply signal, where the protection transistor reduces current to the power control transistor when the power amplifier supply signal reaches a predetermined level.

2. The power control loop of claim 1, further comprising a diode configured to bias the protection transistor.

3. The power control loop of claim 2, further comprising a saturation detection transistor coupled to the protection transistor, where the saturation detection transistor is responsive to a voltage signal at the protection transistor and provides a logic signal when the voltage signal drops below a predetermined level.

4. A method for operating a linear power control loop for a power amplifier, comprising:
   providing a direct current (DC) baseband signal representing an output of a power amplifier to a comparator;
   comparing the DC baseband signal to a reference signal;
   generating an error signal;
   linearly controlling the output of a power amplifier using a power amplifier control current driver; and
   providing over-current protection to a power control transistor responsive to a power amplifier supply signal, wherein current to the power control transistor is reduced when the power amplifier supply signal reaches a predetermined level.

5. The method of claim 4, further comprising:
   adding a supplemental current to the error signal, whereby the output of the power amplifier remains proportional to the error signal.

6. The method of claim 4, wherein providing over-current protection to a power control transistor comprises using a transistor.

7. The method of claim 6, wherein the transistor is responsive to a power amplifier supply signal.

8. The method of claim 4, further comprising: using a diode to bias the transistor.

9. The method of claim 4, further comprising:
   determining when the power control transistor enters a saturation mode; and
   providing a logic signal when the power control transistor enters the saturation mode.

10. A system for linearly controlling output power in a portable cellular transceiver, comprising:
    a power amplifier responsive to a power supply signal;
    a detector for providing a direct current (DC) baseband signal representing an output of the power amplifier;

a comparator for comparing the DC baseband signal to a reference signal and generating an error signal;

a filter for processing the error signal and generating a filtered error signal; and a power amplifier control current driver for linearly controlling the output of the power amplifier comprising:

a power control transistor responsive to the filtered error signal and configured to add a supplemental current to the filtered error signal, wherein the output of the power amplifier remains proportional to the filtered error signal; and an over-current protection circuit coupled to the power control transistor comprising a protection transistor responsive to a power amplifier supply signal, where the protection transistor reduces current to the power control transistor when the power amplifier supply signal reaches a predetermined level.

11. The system of claim 10, further comprising a diode configured to bias the protection transistor.

12. The system of claim 11, further comprising a saturation detection transistor coupled to the protection transistor, where the saturation detection transistor is responsive to a voltage signal at the protection transistor and provides a logic signal when the voltage signal drops below a predetermined level.

13. A power amplifier control for linearly controlling the output of a power amplifier, comprising:

a power control transistor responsive to an error signal and configured to add a supplemental current to the error signal, wherein the output of the power amplifier remains proportional to the error signal; and an over-current protection circuit coupled to the power control transistor comprising a protection transistor responsive to a power amplifier supply signal, where the protection transistor reduces current to the power control transistor when the power amplifier supply signal reaches a predetermined level.

14. The power amplifier control of claim 13, wherein the over-current protection circuit comprises a diode configured to bias the protection transistor.

15. The power amplifier control of claim 13, wherein the over-current protection circuit comprises a saturation detection transistor coupled to the protection transistor, where the saturation detection transistor is responsive to a voltage signal at the protection transistor and provides a logic signal when the voltage signal drops below a predetermined level.

16. The power amplifier control of claim 15, wherein the logic signal is coupled to a baseband subsystem configured to generate a power amplifier control signal.

* * * * *